US005126960A

United States Patent [19]

Thong

[11] Patent Number: 5,126,960

[45] Date of Patent: Jun. 30, 1992

[54] GENERATION OF PHASE RELATED WAVEFORMS

[75] Inventor: Tran Thong, Beaverton, Oreg.

[73] Assignee: Tektronix, Inc., Beaverton, Oreg.

[21] Appl. No.: 541,875

[22] Filed: Jun. 21, 1990

[51] Int. Cl.[5] ........ G06F 1/02

[52] U.S. Cl. ........ 364/721

[58] Field of Search ........ 364/718, 721

[56] References Cited

U.S. PATENT DOCUMENTS

| | | | |
|---|---|---|---|
| 4,745,628 | 5/1988 | McDavid et al. | 364/721 |
| 4,992,743 | 2/1991 | Sheffer | 364/718 |
| 4,998,072 | 3/1991 | Sheffer | 364/718 |

*Primary Examiner*—Long T. Nguyen

*Attorney, Agent, or Firm*—John P. Dellett; Francis I. Gray

[57] ABSTRACT

A pair of waveforms in quadrature relation, or otherwise phase related, are generated from a single direct digital synthesizer employing a single wave lookup table memory. Successive addresses are applied to the memory representing the desired phase difference between the two waveforms plus a fractional part of the increment desired between successive samples along the waveforms. Samples are selected for reconstructing the two respective waveforms by dividing down the sampling clock and providing timing signals therefrom coincident with the correct samples.

12 Claims, 2 Drawing Sheets

GENERATION OF PHASE RELATED WAVEFORMS

BACKGROUND OF THE INVENTION

The present invention relates to the generation of phase related waveforms and particularly to a method and apparatus for accurately generating such waveforms with a savings of component parts.

For the testing of RF circuits, for example as used to generate certain television signals, it is desirable to generate a "sine" signal in quadrature with a "cosine" signal at the same frequency. In television transmission circuitry, the color difference "I" and "Q" signals have this relationship.

A typical circuit for accurately generating quadrature waves involves two independent direct digital synthesizers, wherein a separate direct digital synthesizer is employed to generate each one of the quadrature related signals. Each direct digital synthesizer comprises a wave lookup table memory storing digital sample values representing points along the waveform. An accumulator, used to address the wave lookup table memory, steps along selected waveform values at a rate for generating a sine wave output of a given frequency when coupled to a D/A converter. A pair of such direct digital synthesizers properly synchronized with one another can be used to generate the quadrature related signals.

Another method for generating the desired quadrature signals employs a single accumulator to address a pair of memory devices, one containing values representing a sine wave and the other bearing values representing the corresponding cosine wave. Again, the outputs derived from the two memories are supplied to respective D/A converters from which the desired quadrature related signals are developed.

SUMMARY OF THE INVENTION

In accordance with the present invention, in a preferred embodiment thereof, a single direct digital synthesizer including a single wave lookup table memory is employed to produce two quadrature related waveforms. Successive addresses for the retrieval of samples in the wave lookup table memory are generated by digitally accumulating an input number, wherein such number establishes the spacing between samples according to the desired phase difference between two waveforms. Thus, in the instance of generating quadrature signals, the accumulated input number establishes a spacing between samples to provide a ninety degree phase difference between successive samples. In accordance with a preferred embodiment of the invention, the sample spacing includes an additional incremental amount that accumulates during each cycle of retrieval through the wave lookup table memory to provide successive samples of varying amplitude for each waveform.

In a particular example of the present invention, provided with a wave lookup table memory storing 1,024 digital samples of a sine wave, successive samples were retrieved for every 1,024/4 addresses (to provide ninety degree spacing), plus an incremental amount so that the addresses advance or step along the two quadrature related waveforms to provide the desired amplitude varying outputs.

In a preferred embodiment, the digital outputs representing the two quadrature related waveforms are respectively input to first and second registers which are latched by a divided down version of the clock signal utilized for the accumulator. In a particular embodiment, every fourth sample is latched in a first register, and a selected intervening output is latched in the second register so as to provide digital samples for the quadrature related signal. The outputs of the two registers are applied respectively to D/A converters.

It is accordingly an object of the present invention to provide generation of phase related waveforms in an accurate manner with a minimum of components.

It is another object of the present invention to provide an improved method and apparatus for generating phase related waveforms employing a single direct digital synthesizer provided with a single wave lookup table memory.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DETAILED DESCRIPTION

Figure 1:
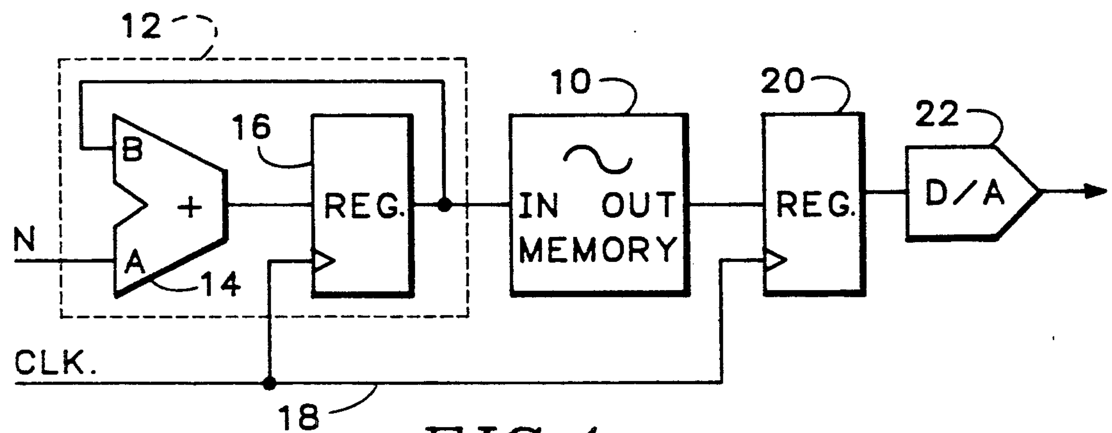
FIG. 1 is a block diagram of a prior art direct digital synthesizer.

Referring to the drawings, FIG. 1 portrays a prior art direct digital synthesizer as may be employed to generate a sine wave or other repetitive waveform. Sequential values representing the amplitude of the waveform at incrementally small time intervals are stored at sequential address locations in wave lookup table memory 10. Phase accumulator 12 generates sequential addresses, but ordinarily not every location in memory is accessed. For example, sample values might be accessed at every tenth address to provide a waveform output of a given frequency.

Phase accumulator 12 comprises an adder 14, the output of which is entered into register 16 at the time of a periodic clock pulse delivered on line 18. Initially, an input number, N, is supplied at input terminal A of adder 14, and assuming there is no input provided at terminal B of adder 14, the number N is entered into register 16 at the time of the next clock pulse. The output of register 16 is then applied at terminal B of adder 14 whereby adder 14 generates a sum equal to 2N. At the next occurrence of the clock pulse, 2N will be entered into register 16. As will be seen, sequential sums resident in register 16 will differ by N, with the increasing accumulation being employed as the address for wave lookup table memory 10. Every Nth waveform amplitude value will then be entered into register 20 as clock pulses occur on line 18. D/A converter 22 receives the sample values and forms an analog output corresponding thereto for simulating the desired waveform. It will be seen that for N large, the samples are more widely spaced along the waveform stored in memory 10 and an output of relatively high frequency will be provided, while for N low, the addresses are more closely spaced in value and a longer time is required to read through a complete sine wave cycle or the like. Therefore, an analog output of relatively lower frequency is produced in the latter case, assuming, of course, the clock rate remains constant. Successive samples along a sine wave are illustrated at 31, 32, 33, . . . 34 in FIG. 3.

As hereinbefore mentioned, in order to generate analog signals having a quadrature relationship, it is common to employ two direct digital synthesizers of the type illustrated in FIG. 1, one to provide a "sine" wave, and a second direct digital synthesizer, synchronized with the first, to produce a "cosine" wave. Alternatively, it is possible to utilize a single phase accumulator 12 that generates addresses for simultaneous application to a first wave lookup table memory 10 storing a "sine" wave and a second wave lookup table memory storing the corresponding "cosine" wave. However, this duplication of components is rendered unnecessary according to the present invention.

Figure 2:
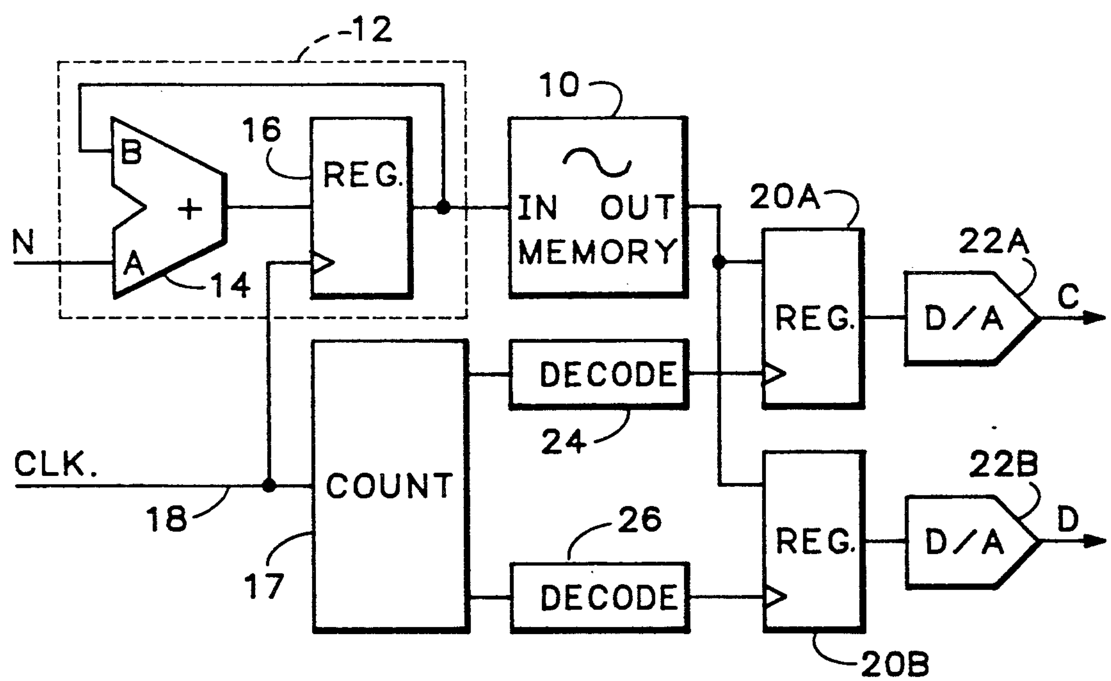
FIG. 2 is a block diagram of a direct digital synthesizer circuit according to the present invention.

Referring to FIG. 2, illustrating circuitry according to the present invention, wherein like elements are referred to utilizing reference numerals corresponding to those of FIG. 1, an accumulator 12 is again employed for successively addressing wave lookup table memory 10 sequentially storing amplitude values for a sine wave or the like. The memory 10 may store any sequential, repetitive portion or segment of the waveform, wherein for present purposes the term "segment" is meant to comprehend a cycle of the waveform or some other repetitive portion thereof. In the FIG. 2 embodiment, registers 20A and 20B receive the waveform sample digital numbers from memory 10 and supply values to D/A converters 22A and 22B. However, the numbers entered into register 20B are intended to represent a waveform in quadrature with or having some other fixed phase relationship with the numbers entered into register 20A.

Figure 3:
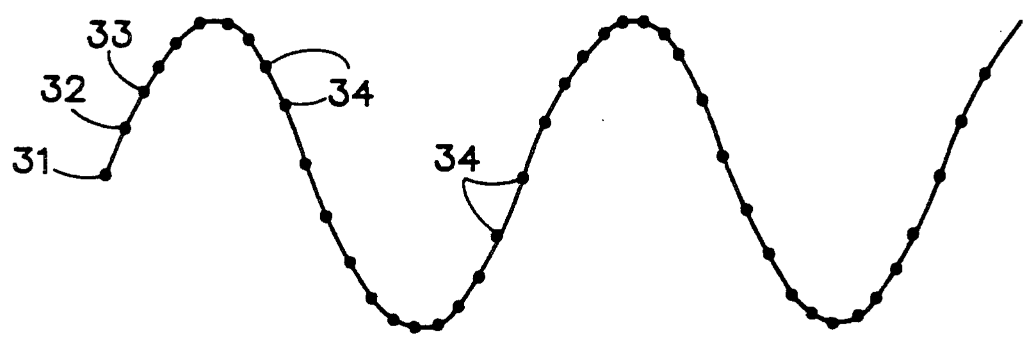
FIG. 3 is a representation of sampling of a waveform employing the prior art direct digital synthesizer.

Instead of entering consecutive numbers from memory 10 into register 20A as represent consecutive amplitude values along a single segment or cycle of the waveform stored in memory 10 (as illustrated in FIG. 3), it is preferred that only one sample from each segment or cycle retrieved from memory 10 is entered into register 20A. Other intervening samples, one for each segment or cycle as stored in memory 10, are entered into register 20B, but wherein these samples represent a waveform having a desired phase difference from the waveform represented in register 20A.

In the circuit of FIG. 2, instead of the number N input to accumulator 12 representing a sampling interval along a given waveform, N instead is employed to represent the phase difference between two output waveforms. As a result, a first sample output value derived from memory 10 for an input address N will be entered into register 20A. The next sample output from memory 10, addressed by address 2N, is entered into register 20B. On ensuing cycles of retrieval or passes through the waveform segments stored in memory 10, successive incremental portions of the two waveforms will be represented in registers 20A and 20B respectively. To ensure that the addressing steps along the entries in memory 10 to provide successive values for the two waveforms, the input number N does not precisely represent the phase difference between the two desired signals. Rather, the number N represents the desired phase difference between the outputs at C and D plus an incremental value which accumulates during passes through memory 10 to step along the waveforms so as to produce complete waveform outputs at C and D. As will hereinafter more fully appear, this increment does not affect the desired output phase difference.

A number of additional outputs will be accessed from memory 10 using the input number N as described above. In order to enter only desired values in registers 20A and 20B, a counter 17 receives the clock signal on line 18 and "divides down" such clock signal. Thus, in a given example hereinafter described, counter 17 counts to four and repeats. For the first count, decoder 24 responds and latches the number retrieved from memory 10 in register 20A. At count two, decoder 26 operates register 20B to receive the number retrieved from memory 10. The function of this circuit will be clarified by the following example.

Let us assume that it is desired to generate two quadrature signals at a 250 megasamples per second rate using a 1,024 entry sine table memory 10. Also assume that the desired output frequency of the waveforms is 12 megahertz. The normal procedure for direct digital synthesis, using circuitry of type illustrated in FIG. 1, would be to use the clock rate for the clock signal on line 18 of 250 megasamples per second and step through the sine table memory 10 with increments of 49.152 steps each clock cycle. While the memory 10 recognizes only integer addresses, the fractional part is left to accumulate in register 16. Thus, N equals 49.152. If a sine table and a cosine table were simultaneously accessed by the same accumulator, or if two synchronized accumulators were employed for two duplicate direct digital synthesizers, the desired quadrature signals would be provided.

However, with the circuit of FIG. 2, and utilizing this same numerical example as described above, the clock rate is increased to 1 gigasample per second and the sine table memory is accessed with N equal to 268.288 steps for each clock cycle. The value for N of 268.288 is obtained as follows. Since there are 1,024 entries in the table memory 10, and it is desired to produce two signals having a quadrature relation, N is made equal to 1,024/4 plus an increment value. The figure 1,024/4 provides separation between samples of substantially ninety degrees. In the circuitry according to FIG. 2, the first sample for a given pass through the waveform memory is entered into register 20A, while the second sample having a phase difference of substantially ninety degrees from the first is entered into register 20B. For present purposes, the third and fourth numbers accessed from memory 10 (at approximately the one hundred eighty degree and two hundred seventy degree locations on a waveform) are ignored. The next following number retrieved from memory 10 is again entered into register 20A, and so on.

The incremental value added to N, in order to ensure the incremental stepping along the waveform, is equal in the present example to 49.152/4. It will be recalled above that using the prior art circuitry example, 49.152 steps were employed for each clock cycle. In the present instance, it is desired that this spacing be accumulated over a full pass through memory 10, so that when the next sample for register 20A is taken, it will differ from the previous sample by 49.152 steps along the waveform, albeit a different repetition of the waveform. It is seen 49.152/4 will accumulate to 49.152 by the time of the next pass through memory 10. N then equals 49.152/4+1,024/4=268.288 steps each clock cycle.

The following sine table addresses are generated. Also shown is the angle in degrees of the corresponding function.

TABLE I

| address | degrees | address | degrees |
|---|---|---|---|
| 0 | 0 | 98 | 34.5 |
| 268 | 94.2 | 366 | 128.7 |
| 536 | | 634 | |
| 804 | | 903 | |
| 49 | 17.2 | 147 | 51.6 |
| 317 | 111.4 | 415 | 145.9 |
| 585 | | 684 | |
| 854 | | 952 | |

If we consider a set of four consecutive outputs, the first is latched in register 20A and converted to analog form through D/A converter 22A. The second is latched in register 20B and converted to analog form via D/A converter 22B. The third and fourth outputs from memory 10 are ignored.

Referring more particularly to the waveform representation of FIG. 3, the waveform depicted illustrates operation according to the first numerical example given above, i.e. for the prior art circuit. Again assume the direct digital synthesizer of FIG. 1 is being employed and that sampling takes place at a 250 Ms/s rate using a 1,024 entry sine table memory 10. The sine table memory is cycled through with an increment of 49.152 steps each clock cycle. The waveform in FIG. 3 represents the locus of amplitude values as stored in memory 10, or the waveform as suitably derived from the output of D/A converter 22 in FIG. 1. For the parameters given, successive samples 31, 32, 33, etc. are accessed along the waveform at approximately 17.2 degree intervals and as hereinbefore explained, these numerical values are applied to D/A converter 22 for conversion into the analog output. Two such synthesizers are employed to provide phase-related outputs.

Figure 4:
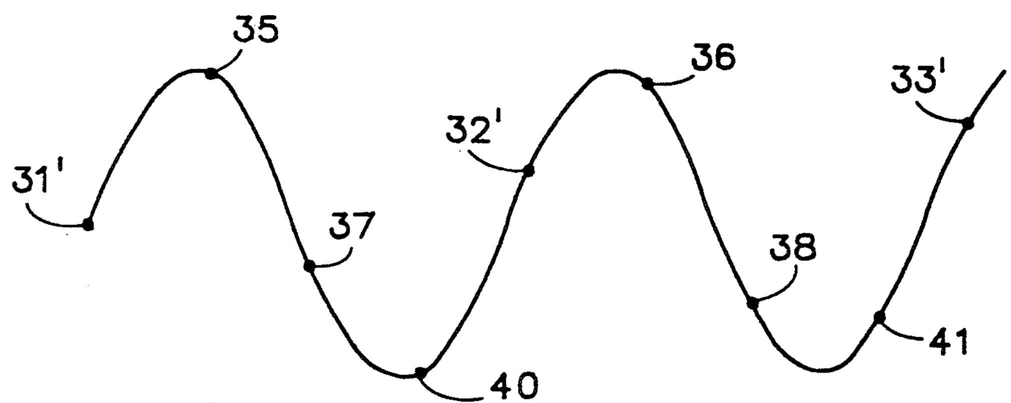
FIG. 4 is a waveform representation of sampling in accordance with the present invention.

By comparison, in accordance with the present invention a first sample 31' for a first sine waveform is derived during a first cyclic pass through the wave lookup table memory 10 as illustrated in FIG. 4, while a second sample 32' is retrieved during a second cyclic pass through the same wave lookup table memory 10. During a third pass, sample value 33' is read out with subsequent values being accessed during successive cycles. These values are entered into register 20A. It will be seen the samples are provided at slightly greater than ninety degree intervals. Because a total increment equaling 49.152 is added to the input number N for each pass through the lookup table memory, the successive samples 31', 32' and 33' are thus successively stepped along repetitions of the waveform, and as a matter of fact bear the same relation to the waveform repetitions as did samples 31, 32 and 33 in the FIG. 3 representation. A fractional part (one-fourth in the example) of the total increment desired (49.152) was provided for each of the four samples during a cyclic pass.

Intermediate successive samples 35, 36, etc. are provided next after samples 31', 32', etc., and are entered into register 20B instead of register 20A as explained above. Third samples 37, 38, and the fourth samples 40, 41 are ignored in this embodiment but could be entered into further registers if it was desired to provide other phase related waveform outputs.

Figure 5:
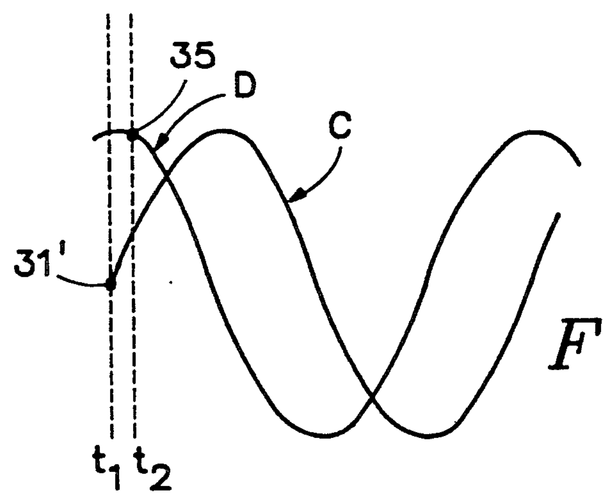
FIG. 5 is a representation of quadrature waveforms generated in accordance with the present invention.

As will be noted from Table I, the phase difference between the first and second waveform outputs is 94.2 degrees rather than ninety degrees. This difference is consistent along the Table, e.g. 111.4 minus 17.2 also equals 94.2 degrees. The divergence from ninety degrees is caused by the added incremental value; however, it will be noted that in each case the sample for the first of the two phase related waveforms (e.g. 31' in FIG. 4) is obtained before the sample for the second of two phase related waveforms (such as sample 35 in FIG. 4). FIG. 5 is a composite view of the two outputs C and D wherein sample 31' is provided at time $t_1$ and sample 35 is provided at time $t_2$, the difference between times $t_2$ and $t_1$ in the foregoing numerical example being one nanosecond. Although the sample 35 is taken at a point slightly past ninety degrees (94.2 degrees to be exact) it is also taken later in time (one nanosecond later). As a consequence, the waveforms C and D have the desired quadrature relationship as shown.

It will be observed that the added fraction of phase increment (i.e. one-fourth of the total of 49.152 steps in the example) is in proportion to the ratio of said phase shift amount, 90 degrees, to 360 degrees. The input number, N, is a rational fractional part (one-fourth) of the accessed memory addresses, plus the added fraction. The memory is accessed at a rate equal to the inverse of said fraction multiplied by the rate required to retrieve samples to reproduce said waveform employing the total phase increment in the FIG. 1 circuit, e.g., 4 * 250 Ms/s=1 Gs/s in the example given.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of generating phase related waveforms comprising the steps of:

retrieving plural waveform samples from a single wave lookup table memory storing values representing a waveform segment, said samples being retrieved on a cyclic basis to provide waveform representation, generating successive addresses for said retrieval of samples in said wave lookup table memory by digitally accumulating an input number, wherein said number establishes a spacing between samples according to a desired phase difference between two phase related waveforms, selecting the samples for each of said two waveforms, and converting the samples for each waveform into an analog signal.

2. The method according to claim 1 wherein said spacing includes an additional incremental amount that accumulates during each cycle of retrieval in said wave lookup table memory to assure successive samples of varying amplitude for each of said two phase related waveforms.

3. The method according to claim 2 wherein the selecting step comprises selecting one sample of each of said two phase related waveforms during each cycle of retrieval through said wave lookup table memory.

4. The method according to claim 3 wherein the input number is a rational fractional part of the number of values stored in the wave lookup table memory plus said additional incremental amount.

5. A method of generating phase related waveforms comprising the steps of:

retrieving waveform samples from a wave lookup table memory storing values representing a waveform segment, said samples being retrieved on a cyclic basis for waveform representation, addressing a first sample and a second sample on each cyclic pass through said memory, said first sample and said second sample differing in phase by a desired phase shift amount for said phase related waveforms, said addressing being advanced so that successive first samples provide a first waveform of given frequency, while successive second samples provide a second waveform of the same frequency but differing from said first waveform by said phase shift amount.

6. A method of generating phase related waveforms comprising the steps of:

retrieving waveform samples from a wave lookup table memory storing values representing a waveform segment, said samples being retrieved on a cyclic basis for waveform representation, addressing successive selected samples for retrieval on cyclic passes through said memory which differ in phase in the stored waveform segment by a predetermined phase shift amount plus a phase increment as required to retrieve samples for reproducing a waveform at given frequency from said memory, selecting a first retrieved sample on each cyclic pass through said memory to reconstruct a first waveform of said given frequency, and selecting a second retrieved sample on each cyclic pass through said memory to reconstruct a second waveform of said given frequency but differing in phase form said first waveform by said phase shift amount.

7. The method according to claim 6 wherein a ratio of said phase shift amount to three hundred sixty degrees is a rational fraction.

8. The method according to claim 7 wherein said memory is accessed at a clock rate equal to the inverse of said fraction multiplied by a sample rate required to retrieve samples to reproduce said waveform of given frequency employing said phase increment.

9. The method according to claim 6 wherein said phase shift amount is substantially ninety degrees to provide quadrature related waveforms.

10. The method according to claim 6 wherein said first sample is retrieved before said second sample so that the first and second waveforms differ in phase by substantially said phase shift amount.

11. Apparatus for generating phase related waveforms comprising:

a wave lookup table memory for storing values representing a waveform segment, means for retrieving sample values on a cyclic basis to provide waveform representation according to successive addressing of said memory, means for supplying the successive addresses for said memory by digitally accumulating an input number that establishes a spacing between sample values representing a desired phase difference between two phase related waveforms, said spacing between sample values further including an amount for providing successive sample values of varying amplitude for each of said two waveforms, means for separating sample values for said two waveforms, and first and second means, respectively receiving said sample values for said two waveforms, for converting said two waveforms to analog signals.

12. The apparatus according to claim 11, further comprising means for providing a clock pulse for operating said means for retrieving sample values for each cyclic pass through said memory, wherein said means for separating sample values includes means for dividing down said clock pulse to provide timing signals, and first and second registers receiving the outputs of said memory as coincide with selected timing signals for storing samples of said first and second waveforms respectively.

* * * * *